(12) United States Patent
Yamazaki

(10) Patent No.: US 6,232,642 B1
(45) Date of Patent: May 15, 2001

(54) SEMICONDUCTOR DEVICE HAVING IMPURITY REGION LOCALLY AT AN END OF CHANNEL FORMATION REGION

(75) Inventor: Shunpei Yamazaki, Tokyo (JP)

(73) Assignee: Semiconductor Energy Laboratory Co., Ltd., Kangawa-ken (JP)

( * ) Notice: Subject to any disclaimer, the term of this patent is extended or adjusted under 35 U.S.C. 154(b) by 0 days.

(21) Appl. No.: 09/103,473

(22) Filed: Jun. 24, 1998

(30) Foreign Application Priority Data

Jun. 26, 1997 (JP) .................................................. 9-185854

(51) Int. Cl.$^7$ .......................... H01L 29/78; H01L 29/76; H01L 23/62

(52) U.S. Cl. .................... 257/404; 257/357; 257/605; 257/590; 257/409; 257/403; 257/392; 257/327

(58) Field of Search ................... 257/404, 409, 257/403, 352, 240, 590, 605, 357, 392, 327; 438/217, 289

(56) References Cited

U.S. PATENT DOCUMENTS

| | | |
|---|---|---|
| 4,454,524 | 6/1984 | Spence . |
| 4,549,336 | 10/1985 | Sheppard . |
| 4,697,198 | 9/1987 | Komori et al. . |
| 4,710,788 | 12/1987 | Dämbkes et al. . |
| 4,959,697 | 9/1990 | Shier et al. . |
| 4,999,682 | 3/1991 | Xu et al. . |
| 5,196,367 | 3/1993 | Lu et al. . |
| 5,198,879 | 3/1993 | Ohshima . |
| 5,210,437 * | 5/1993 | Sawada et al. .................... 247/403 |
| 5,272,365 | 12/1993 | Nakagawa . |
| 5,324,960 | 6/1994 | Pfiester et al. . |
| 5,343,051 | 8/1994 | Yamaguchi et al. . |
| 5,350,940 | 9/1994 | Rona . |
| 5,357,137 * | 10/1994 | Hayama ............................. 257/396 |
| 5,426,325 | 6/1995 | Chang et al. . |
| 5,428,234 | 6/1995 | Sumi . |
| 5,449,937 | 9/1995 | Arimura et al. . |
| 5,461,250 | 10/1995 | Burghartz et al. . |
| 5,532,175 | 7/1996 | Racanelli et al. . |
| 5,548,143 | 8/1996 | Lee . |
| 5,606,191 | 2/1997 | Wang . |
| 5,608,231 | 3/1997 | Ugajin et al. . |
| 5,614,752 * | 3/1997 | Takenaka ............................. 257/356 |
| 5,619,053 | 4/1997 | Iwamatsu et al. . |
| 5,635,749 | 6/1997 | Hong . |
| 5,661,059 | 8/1997 | Liu et al. . |
| 5,670,389 | 9/1997 | Huang et al. . |
| 5,674,788 | 10/1997 | Wristers et al. . |

(List continued on next page.)

FOREIGN PATENT DOCUMENTS

WO 88/03328  5/1988  (WO) .

OTHER PUBLICATIONS

Holloway et al., "0.18 $\mu$m CMOS Technology for High–Performance, Low–Power, and RF Applications", 1997 Symposium on VLSI Technology Digest of Technical Papers, pp. 13–14.

*Primary Examiner*—Alexander O. Williams
(74) *Attorney, Agent, or Firm*—Eric J. Robinson; Nixon Peabody LLP

(57) ABSTRACT

There is provided a semiconductor device having a novel structure in which high reliability and high field effect mobility can be simultaneously achieved. In an insulated gate transistor formed on a single crystal silicon substrate, pinning regions 105 and 106 are formed at the ends of a channel formation region 102. The pinning regions 105 and 106 suppress the expansion of a depletion layer from the drain side to prevent a short channel effect. In addition, they also serve as a path for extracting minority carriers generated as a result of impact ionization to prevent breakdown phenomena induced by carrier implantation.

46 Claims, 6 Drawing Sheets

U.S. PATENT DOCUMENTS

| | | |
|---|---|---|
| 5,698,884 | 12/1997 | Dennen . |
| 5,702,967 * | 12/1997 | Tseng ................................. 437/45 |
| 5,786,618 | 7/1998 | Wen . |
| 5,792,679 | 8/1998 | Nakato . |
| 5,801,416 | 9/1998 | Choi et al. . |
| 5,831,294 | 11/1998 | Ugajin . |
| 5,859,443 | 1/1999 | Yamazaki et al. . |
| 5,885,872 * | 3/1999 | Tamaki et al. ..................... 438/275 |
| 5,893,740 * | 4/1999 | Chang et al. ...................... 438/289 |
| 5,894,137 | 4/1999 | Yamazaki et al. . |
| 5,894,151 | 4/1999 | Yamazaki et al. . |

* cited by examiner

SEMICONDUCTOR DEVICE HAVING IMPURITY REGION LOCALLY AT AN END OF CHANNEL FORMATION REGION

BACKGROUND OF THE INVENTION

1. Field of the Invention

The present invention relates to a semiconductor device formed using a single crystal silicon substrate and, more particularly, to a configuration of an insulated gate field effect transistor (referred to as "MOSFET" or "IGFET").

The present invention is a technique which is effective for the fabrication of a fine device having a channel length and a channel width equal to or less than 1 µm (typically in the range from 30 to 500 nm).

The present invention can be applied to various semiconductor integrated circuits such as ICs, VLSIs and ULSIs which are formed by integrating MOSFETs.

2. Description of the Related Art

Recently, integrated circuits such as VLSIs are becoming increasingly finer, which has resulted in a need for processing dimensions in a deep submicron domain wherein the channel length (L) of a MOSFET is 0.2 µm or less, more preferably, 0.1 µm or less.

Similarly, processing dimensions as fine as 0.2 µm or less are also required for the gate width (W), and a device size satisfying a relationship L:W=1:1 has been proposed.

However, a phenomenon referred to as "short channel effect" is known as a factor which hinders semiconductor devices from being made finer. The short channel effect represents various problems such as a decrease in a withstand voltage between a source and a drain and a decrease in a threshold voltage which occur as a result of a decrease in a channel length. The short channel effect is detailed in "Mitsumasa Koyanagi et al., "Submicron Device I, pp. 88–138, Maruzen K. K., 1987.

According to this article, one of the most commonly known causes of a decrease in a withstand voltage is punch-through which is a phenomenon wherein, as a result of a decrease in a channel length, electric potential at a depletion layer toward the drain (referred to as "drain-side depletion layer) affects a region toward the source to decrease diffusion potential near the source (drain-induced barrier reduction), thereby making it difficult to control carriers using a gate voltage.

FIGS. 3A and 3B schematically show how this occurs. In FIGS. 3A and 3B, 301 represents a single crystal silicon substrate; 302 represents a source region; 303 represents a channel formation region; 304 represents a drain region; 305 represents a field oxide (device separation insulator); 306 represents a gate insulator; and 307 represents a gate electrode. The dotted line indicated by 30 represents a depletion layer formed during the operation.

Normally, a depletion layer having a uniform depth is formed under a channel which is formed directly under the gate electrode 307. However, when the channel length (L) is extremely short, a depletion layer that extends from the side of the drain drain-side depletion layer) comes into contact with a depletion layer toward the source as indicated by the arrow in FIG. 3A.

As a result, a potential barrier in the vicinity of the source is decreased by the drain voltage to cause an unintended flow of a current even when no gate voltage is applied. This is the so-called "punch-through" which can reduce the withstand voltage between the source and drain.

There is a phenomenon called "impact ionization of implanted carriers" which is another cause of a decrease in the withstand voltage between the source and drain. A description will be made on the same with reference to an n-channel MOSFET as an example.

When electrons (majority carriers) are pulled by a strong electric field to reach a high energy state in the vicinity of the drain, they collide with a silicon lattice to generate a great amount of electron-hole pairs. The holes thus generated (minority carriers) are pushed back by the electric field of the drain and flow into the source terminal or substrate terminal through a depletion layer under the channel or the substrate. Those holes cause a breakdown phenomenon induced by the implantation of the carriers.

There are two mechanisms for this. Specifically, one of the mechanisms is that a hole current flowing into the substrate terminal causes conduction through a parasitic bipolar transistor which is formed by the source, substrate and drain serving as an emitter, base and collector, respectively.

The other mechanism is that the holes which have flowed into the depletion layer of the substrate in the vicinity of the source reduce the diffusion potential near the source to reduce the potential barrier.

While various measures have been taken against the short channel effect as described above, the most common measure is channel doping. Channel doping is a technique to shallowly dope the entire channel formation region with a very small amount of an impurity element such as P (phosphorus) or B (boron) to suppress the short channel effect (see Japanese unexamined patent publications (KOKAI) No. H4-206971 and No. H4-286339).

However, channel doping has a problem in that it places a significant limitation on field effect mobility of a MOSFET (hereinafter simply referred to as "mobility"). Specifically, an intentionally added impurity element interferes with the movement of the carries to reduce the mobility of the same.

For example, there is a report indicating that mobility achievable in conventional standard MOSFETs is only 300 $cm^2/Vs$ for n-channel MOSFETs and 70 $cm^2/Vs$ for p-channel MOSFETs (See D. T. Grider et. al., "Symposium on Technology Digest of Technical Papers", pp 47, 1997).

The present invention has been conceived taking the above-described problems into consideration, and it is an object of the invention to provide a semiconductor device having a novel structure with which high reliability and high field effect mobility can be achieved simultaneously.

SUMMARY OF THE INVENTION

According to one aspect of the present invention, there is provided a semiconductor device comprising at least:

a source region, a drain region and a channel formation region formed using a single crystal semiconductor;

a field oxide surrounding the source region, drain region and channel formation region; and a gate insulator and a gate electrode formed on the channel formation region, wherein an impurity region shifting an energy band of the channel formation region is intentionally and locally provided only at an end of the channel formation region which is in contact with the field oxide, and the impurity region suppresses the expansion of a depletion layer from the drain region toward the source region.

According to another aspect of the invention, there is provided a semiconductor device comprising at least:

a source region, a drain region and a channel formation region formed using a single crystal semiconductor;

a field oxide surrounding the source region, drain region and channel formation region; and a gate insulator and a gate electrode formed on the channel formation region, wherein an impurity region shifting an energy band of the channel formation region is intentionally and locally provided only at an end of the channel formation region which is in contact with the field oxide, and the impurity region suppresses the expansion of a depletion layer from the drain region toward the source region and extracts minority carriers generated as a result of impact ionization in the vicinity of the drain region from the channel formation region.

According to still another aspect of the invention, there is provided a semiconductor device comprising at least:

a source region, a drain region and a channel formation region formed using a single crystal semiconductor;

a field oxide surrounding the source region, drain region and channel formation region; and a gate insulator and a gate electrode formed on the channel formation region, wherein an impurity region shifting an energy band of the channel formation region is intentionally and locally provided only at an end of the channel formation region which is in contact with the field oxide, and the impurity region extends also into the source region and/or drain region.

The principle behind the present invention is that an impurity region is intentionally formed at an end of the channel formation region (the end in contact with the field oxide which is different from the end in contact with source and drain regions), and the expansion of a depletion layer from the drain toward the source is suppressed by the impurity region.

The inventors have defined that a word "pinning" is used to mean "suppressing" because the effect of suppressing a depletion layer is as if the depletion layer is pinned up. An FET employing the present invention is referred to as "pinning FET" to clearly distinguish it from conventional MOSFETs.

According to still another aspect of the invention, there is provided a semiconductor device comprising at least:

a source region, a drain region and a channel formation region formed using a single crystal semiconductor;

a field oxide surrounding the source region, drain region and channel formation region; and a gate insulator and a gate electrode formed on the channel formation region, wherein impurity regions shifting an energy band of the channel formation region are intentionally and locally provided only at a central portion of the channel formation region and an end of the channel formation region which is in contact with the field oxide, the impurity region provided at the end suppresses the expansion of a depletion layer from the drain region toward the source region, and the impurity region provided in the central portion controls a threshold voltage.

According to still another aspect of the invention, there is provided a semiconductor device comprising at least:

a source region, a drain region and a channel formation region formed using a single crystal semiconductor;

a field oxide surrounding the source region, drain region and channel formation region; and a gate insulator and a gate electrode formed on the channel formation region, wherein impurity regions shifting an energy band of the channel formation region are intentionally and locally provided only at a central portion of the channel formation region and an end of the channel formation region which is in contact with the field oxide, the impurity region provided at the end suppresses the expansion of a depletion layer from the drain region toward the source region and extracts minority carriers generated as a result of impact ionization in the vicinity of the drain region from the channel formation region, and the impurity region provided at the central portion controls a threshold voltage.

The above-described configurations make it possible to provide a semiconductor device having high mobility and reliability at the same time, which is the object of the present invention. The details of the pinning FET according to the invention will be described with reference to the following preferred embodiments of the same.

DETAILED DESCRIPTION OF PREFERRED EMBODIMENTS

A first embodiment of the present invention will now be described.

Figure 1A:
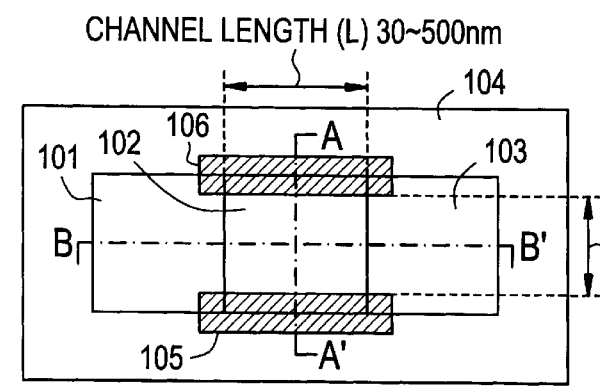
FIGS. 1A, 1B and 1C are schematic views illustrating a pinning FET.
Figure 1B:
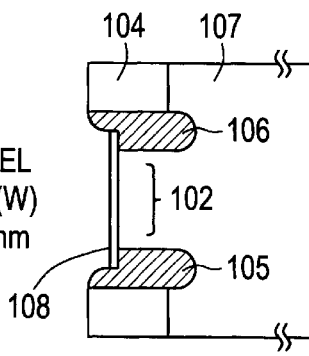
Figure 1C:
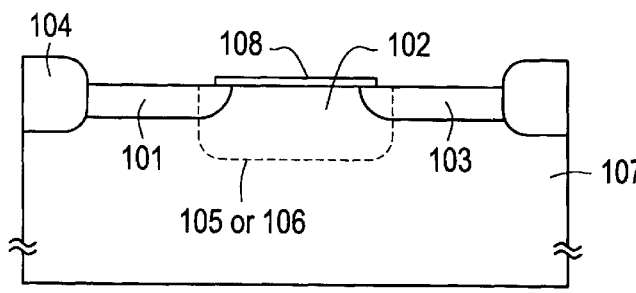

First, a description will be made with reference to FIGS. 1A, 1B and 1C on a configuration of an active region (the source region, channel formation region and drain region are collectively referred to as "active region") of an n-channel pinning FET according to the present invention. FIG. 1A is a plan view; FIG. 1B is a sectional view taken along the line A–A' in the plan view; and FIG. 1C is a sectional view taken along the line B–B' in the plan view.

In FIG. 1A, 101 represents the source region; 102 represents the channel formation region; and 103 represents the drain region. A field oxide 104 is formed such that it surrounds those regions to separate the device from others.

A gate insulator 108 is formed on the active region. A gate electrode, a layer insulator and the like are formed further in practice, although omitted here for simple illustration.

The regions indicated by 105 and 106 are regions for pinning a depletion layer (hereinafter referred to as "pinning regions"), which are the most characteristic of the semiconductor device according to the present invention. The pinning regions 105 and 106 can be formed by adding an impurity element for shifting an energy band in the channel formation region. Therefore, they can be also regarded as regions shifting the energy band.

A description will now be made on the impurity element for shifting the energy band with reference to the conceptual view in FIG. 9. Shifting the energy band means changing the energy state of the channel formation region indicated by the dotted line in FIG. 9 to the energy state indicated by the solid line.

Figure 9:
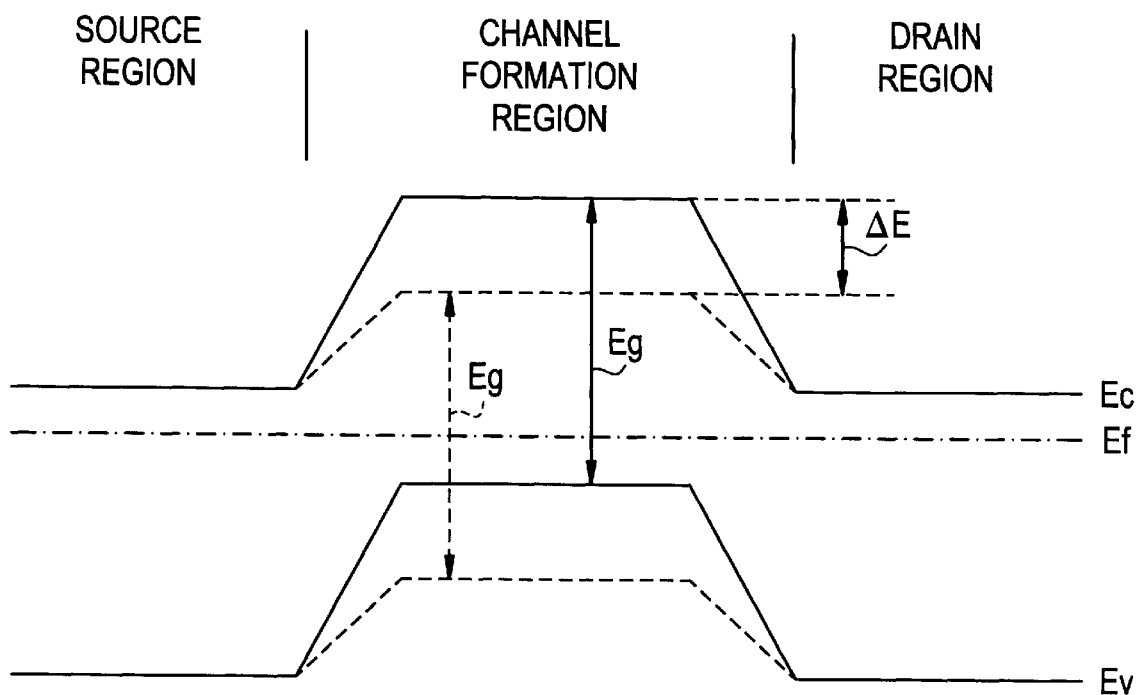
FIG. 9 is a view showing a state of energy in a channel formation region.

FIG. 9 shows a case wherein the channel formation region is doped with an impurity element of the conductivity type opposite to that of the source and drain regions. In this case, no change occurs in the energy gap (Eg) in the doped region, but the energy state as a whole is shifted upward (the apparent Fermi level ΔE goes down).

This results in an energy difference ΔE between the undoped channel formation region and the impurity region. The height of this energy (potential) barrier varies depending on the concentration of the added impurity element.

Thus, the present invention utilizes an impurity element which can shift the energy band of the channel formation region to form a barrier during the formation of the pinning regions.

In the present embodiment, since the source and drain regions are of the n-type conductivity, the pinning regions 105 and 106 are doped with an impurity element of the opposite conductivity type. Specifically, an element chosen from among the group 13, typically B (boron) or In (indium), is added to form p-type impurity regions.

The pinning regions 105 and 106 are formed to a depth greater than the maximum width of a depletion layer formed under the channel and is preferably sufficiently deeper than the junction depth of the drain region 103.

The concentration of the impurities added to the pinning regions 105 and 106 is basically adjusted so that the pinning regions 105 and 106 define a potential barrier which is sufficiently high relative to the channel formation region. Typically, the concentration may be in the range from $1 \times 10^{18}$ to $1 \times 10^{20}$ atoms/cm$^3$.

Referring to FIG. 1A, the pinning regions 105 and 106 are formed such that their ends reach (overlap) the source region 101 and drain region 103. As will be described later in detail, it is one of the important characteristics of the present invention that those regions are formed such that they extend into the source region 101. To achieve the pinning effect, it is not essential to have the pinning regions overlap the drain region 103.

In FIG. 1A, the distance between the source region 101 and drain region 103 is defined as a channel length (L). The present invention is advantageous when this length is 2 μm or less and typically in the range from 30 to 500 nm (more preferably, in the range from 50 to 200 nm). The direction along the channel length is referred to as "channel length direction".

The distance between the pinning regions 105 and 106 is defined as a channel width (W). The present invention is advantageous when this width is in the range from 30 to 500 nm (typically in the range from 50 to 200 nm). The direction along the channel width is referred to "channel width direction".

The present invention is based on an assumption that the lower limit of the channel width is 30 nm considering a need for maintaining an on-current (a current that flows when an FET is in an on-state) and difficulty in forming the pinning regions. Further, it is difficult to achieve the pinning effect with a channel width in the excess of 500 nm.

Although it seems that the pinning effect is reduced when the depth of the channel formation region is sufficiently greater than the channel width, in practice, a sufficient pinning effect can be achieved with a channel width of 500 nm or less because majority carriers that contribute to the operation of a transistor move only in the vicinity of the surface of the channel formation region.

Thus, the channel formation region 102 is in an extremely small size because the present invention is intended for application to semiconductor devices having a very small channel length and channel width.

Therefore, the pinning regions 105 and 106 must be formed using a very minute ion implantation technique. Specifically, pinning regions in the range from 10 to 300 nm (more preferably in the range from 50 to 100 nm) must be formed using a fine exposure technique that employs excimer laser, electron beams or focused ion beams.

FIG. 1B shows a sectional view taken along the line A–A' in the plan view shown in FIG. 1A. In FIG. 1B, the parts illustrated in FIG. 1A will be described using the same reference numbers.

In FIG. 1B, 107 represents a single crystal silicon substrate which is a p-type silicon substrate having high resistance in the present embodiment. As the single crystal silicon substrate 107, a single crystal silicon substrate formed using a normal CZ process, an FZ process or any other fabrication process may be used. However, in order to obtain high carrier mobility, it is preferable to use a high resistance silicon substrate with a small amount of dopant (doped impurities at a low concentration).

The pinning regions 105 and 106 are formed such that they overlap the field oxide 104. A gate insulator 108 is formed on the channel formation region 102 using a thermal oxidation process.

FIG. 1C shows a sectional view taken along the line B–B' in FIG. 1A. As shown in FIG. 1C, the source region 101 and drain region 103 are formed with a well structure by implanting P (phosphorus) or As (arsenic) ions.

FIG. 1C indicates the position of the pinning region 105 (or 106) which is not shown in the sectional view in FIG. 1B by the dotted line. As shown in FIG. 1C, the pinning regions 105 and 106 are formed across the source region 101 and drain region 103.

The n-channel pinning FET according to the invention is a semiconductor device having the structure described above. The functions and effects of the pinning regions 105 and 106 will be described below.

A first effect will be described. The most important object of the present invention is to suppress (pin) the expansion of a depletion layer from the drain side toward the source to prevent a reduction in the potential barrier near the source due to the drain voltage. By suppressing the expansion of the depletion layer, it is possible to sufficiently prevent a decrease of in the threshold voltage and a decrease in the withstand voltage due to punch-through.

Referring to FIGS. 1A, 1B and 1C, the pinning regions 105 and 106 which are intentionally and locally formed in the channel formation region act as a stopper against the depletion layer that tends to extend from the drain side to effectively suppress the expansion of the depletion layer.

This prevents any decrease in the diffusion potential near the source due to the expansion of the depletion layer, thereby preventing the punch-through phenomenon. Further, since this suppresses an increase in the charge of the depletion layer attributable to the expansion of the depletion layer, a decrease in the threshold voltage can be avoided.

As described above, by forming the pinning regions 105 and 106, it is possible to suppress or prevent the short channel effect which has created a very serious problem in achieving fineness. This is the most significant advantage of the semiconductor device according to the present invention.

The above-described effect can be achieved by providing the pinning regions 105 and 106 at least in the vicinity of the junction between the channel formation region 102 and the drain region 103. However, the configuration shown in FIG. 1A is most preferable to achieve a fourth effect to be described later (an effect of extracting minority carriers using the pinning regions).

A second effect will now be described. While the gate electrode in a common MOSFET is formed from $n^+$ type polysilicon, such a gate electrode results in a decrease in the threshold voltage (results in a normally-on operation) in an n-channel MOSFET because its work function is significantly different from that of the channel formation region (p-type silicon substrate). Therefore, channel doping described as the prior art not only prevents the short channel effect but also has the function of controlling the threshold voltage.

In the n-channel pinning FET according to the present invention, however, the pinning regions 105 and 106 significantly reduce the effective channel width to increase the threshold voltage, thereby achieving a proper threshold voltage.

A description will now be made with reference to FIG. 4 on the state of the energy (potential) of the channel formation region 102 and the pinning regions 105 and 106 during the operation of the semiconductor device having the structure shown in FIGS. 1A, 1B and 1C.

Figure 4:
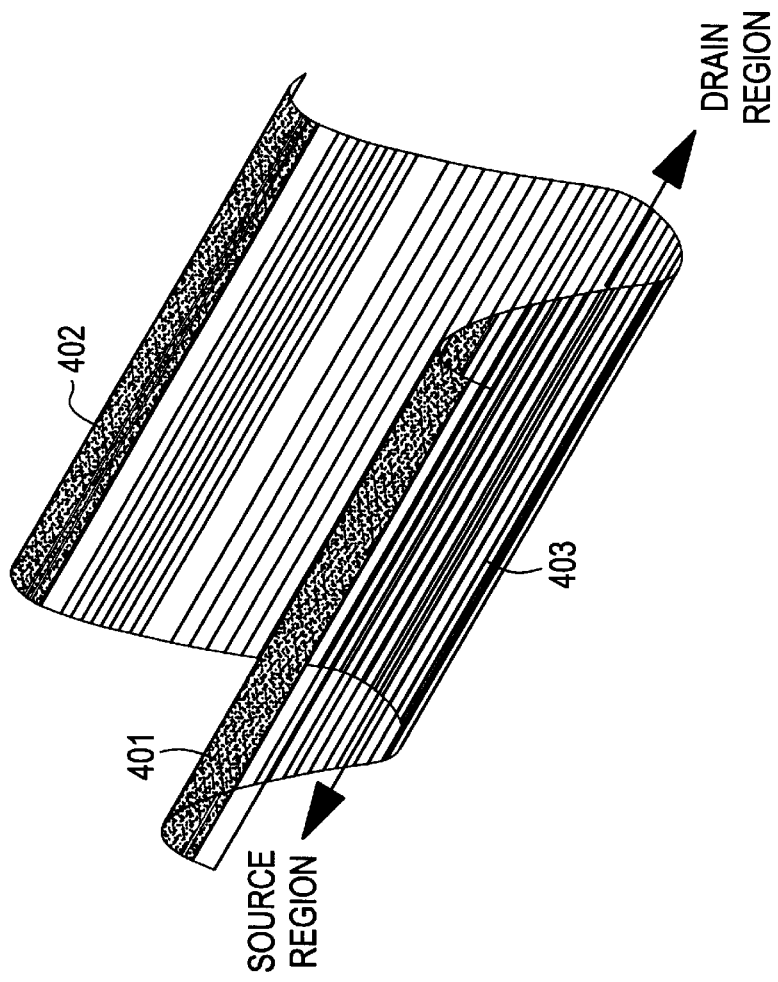
FIG. 4 is a view showing an energy state in a channel formation region.
Figure 3A:
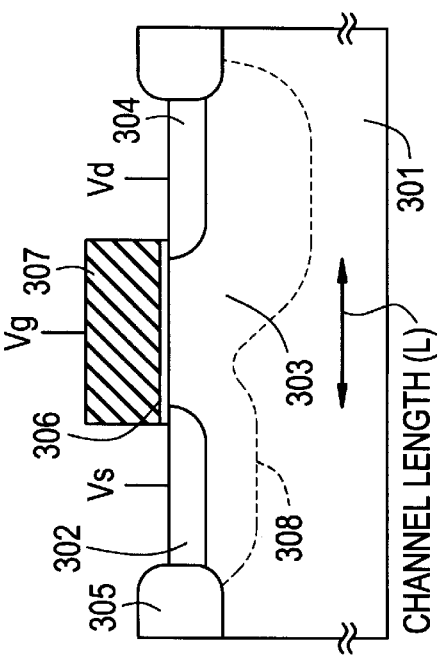
FIGS. 3A and 3B are views for explaining the short channel effect.
Figure 3B:
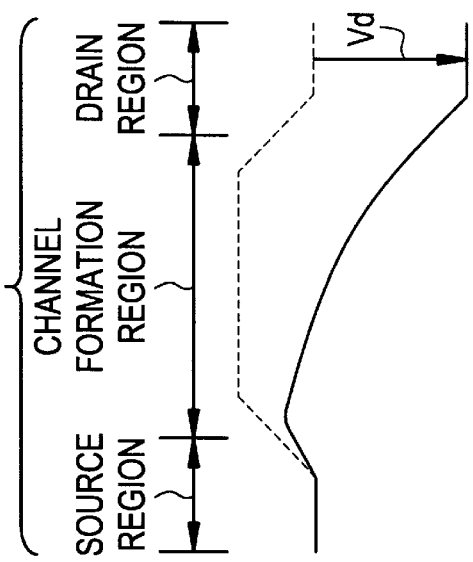

In the operation of the semiconductor device having the structure shown in FIGS. 1A, 1B and 1C, when an inversion layer is formed in the channel formation region 102, an energy state in the form of a deep valley appears in the vicinity of the channel formation region 102 as shown in FIG. 4.

In FIG. 4, the regions indicated by 401 and 402 correspond to the pinning regions 105 and 106, and the region indicated by 403 corresponds to the effective channel formation region 102. As a result of the formation of the inversion layer, the region 403 which is the bottom of the valley enters an energy state which is low relative to electrons. As a result, carriers that have flowed in from the source region move through the region 403 in preference.

Thus, since the pinning regions 105 and 106 form a high energy barrier, the threshold voltage increases in those regions. As a result, the threshold voltage increases also when observed as a whole.

Such an increase in the threshold voltage due to the narrowed channel is generally known as a narrow channel effect. The pinning regions characteristic of the present invention make it possible to produce the narrow channel effect intentionally, and the degree of the narrow channel effect can be controlled by varying the concentration and configuration of the pinning regions.

Therefore, with optimized design of the configuration and size of the pinning regions, it is possible to adjust the channel width (W) and to control the threshold voltage by balancing the short channel effect and the narrow channel effect.

It is advantageous to reduce the difference between the work functions through appropriate selection of the conductivity type of the single crystal silicon layer that forms the channel formation region and the material of the gate electrode. This makes it possible to control the threshold voltage more accurately and easily.

A third effect will now be described. The n-channel pining FET shown in the present embodiment has an advantage in that the channel formation region 102 is a region which is intrinsic or substantially intrinsic to allow majority carriers (electrons) to move therethrough.

An intrinsic region is a region which is not intentionally doped with an impurity element that provides n- or p-type conductivity or an impurity element such as carbon, nitrogen or oxygen. For example, an intrinsic channel formation region can be obtained using an I-type silicon substrate (intrinsic silicon substrate) fabricated using a sophisticated refining technique.

A substantially intrinsic region is a region whose conductivity type is intentionally canceled by doping it with impurities of the opposite conductivity type or a region that exhibits one conductivity type to the extent of allowing control over the threshold voltage.

For example, a silicon substrate may be regarded as intrinsic if the concentration of the dopant (phosphorus, arsenic, boron, indium, antimony or the like) is $5\times10^{17}$ atoms/cm$^3$ or less and the concentration of carbon, nitrogen and oxygen included is $2\times10^{18}$ atoms/cm3. In this sense, any single crystal silicon substrate commonly used in semiconductor circuits is substantially intrinsic provided that no impurity is intentionally added during the process of forming the same.

When a region where carriers move is intrinsic or substantially intrinsic, the reduction of mobility attributable to impurity scattering is quite small. This is a significant advantage of the invention which suppresses or prevents the short channel effect without using channel doping.

The reason is that a conventional IC is doped with impurities on the entire surface of the channel formation region using channel doping. This creates a problem in that only low mobility (field effect mobility) is achieved in spite of the use of single crystal because of impurity scattering.

In the pinning FET according to the present invention, pinning regions are locally provided relative to the channel formation region to prevent the short channel effect and to control the threshold voltage. As a result, the region where carriers move becomes an intrinsic or substantially intrinsic region to provide high mobility.

A fourth effect will now be described. While it has been already described that pinning regions according to the invention have a function of preventing the short channel effect and controlling the threshold voltage, they also play a very important role in preventing a decrease in the withstand voltage between the source and drain due to impact ionization.

As described with reference to the prior art, minority carriers (holes in the present embodiment) generated by impact ionization can cause breakdown phenomena induced by carrier implantation such as conduction of a parasitic bipolar transistor and a decrease in the diffusion potential near the source as a result of the accumulation of the minority carriers in the vicinity of the source.

In the case of the n-channel pinning FET having the structure as shown in FIGS. 1A, 1B and 1C, however, holes generated by impact ionization flow through the pinning regions 105 and 106 to reach the source region 101 as they are. Therefore, the accumulation of the holes can be avoided by connecting an external terminal to the pinning regions 105 and 106 to extract the holes.

Thus, the pinning regions according to the present invention also function as a path for causing the minority carriers (holes) generated by impact ionization to flow in the direction opposite to that of the majority carriers (electrons) and to extract them as they are.

In the present embodiment, since the pinning regions 105 and 106 have the p-type conductivity, only holes can move and electrons can not move. That is, electrons which are the majority carriers flow through the channel formation region 102.

Since this fourth effect makes it possible to prevent breakdown phenomena induced by carrier implantation attributable to impact ionization, this effect provides a reliable semiconductor device having a very high withstand voltage in combination with the first effect (prevention of a decrease in the withstand voltage due to punch-through).

As described above, the n-channel pinning FET described in the present embodiment can achieve very high reliability and high field effect mobility at the same time.

The pinning regions characteristic of the present invention are formed in a channel formation region of an insulated gate field effect transistor, and this technique is not basically limited to the transistor structure.

The present invention is not limited to the structure shown in the present embodiment and may be applied to insulated gate field effect transistors having any structure.

A second embodiment of the present invention will now be described.

Figure 2A:
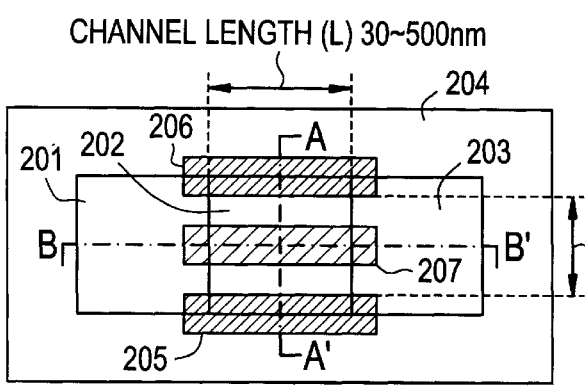
FIGS. 2A, 2B and 2C are schematic views illustrating a pinning FET.
Figure 2B:
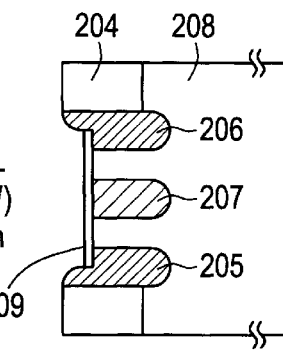
Figure 2C:
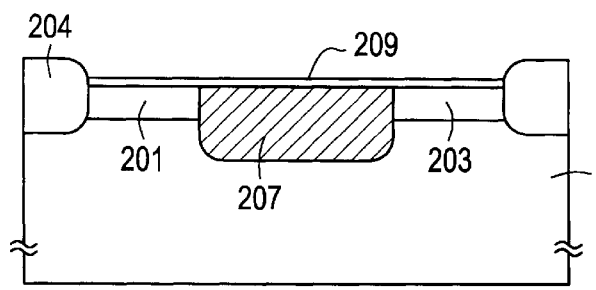

In the present embodiment, a configuration of an active region of a p-channel pinning FET according to the present invention will be described with reference to FIGS. 2A, 2B and 2C. Similarly to FIGS. 1A, 1B and 1C illustrating the first embodiment, FIG. 2A is a plan view; FIG. 2B is a sectional view taken along the line A–A' in the plan view; and FIG. 2C is a sectional view taken along the line B–B' in the plan view.

Since the n-channel and p-channel pinning FETs have the same basic structure, the description will focus only on difference between them and will be omitted for the subjects which have been sufficiently explained with reference to the first embodiment.

In FIG. 2A, 201 represents a source region; 202 represents a channel formation region; 203 represents a drain region; and 204 represents a field oxide. The regions indicated by 205 and 206 are pinning regions which are doped with an impurity element having the n-type conductivity in the present embodiment. Specifically, they are formed by adding an element selected from among the group 15, typically phosphorus or arsenic. Sb (antimony) may be alternatively used.

In this case, the concentration of the impurities added to the pinning regions 205 and 206 may be adjusted similarly to the first embodiment and may typically be in the range from $1 \times 10^{18}$ to $1 \times 10^{20}$ atoms/cm$^3$. As will be described later in detail, the doping concentration may be kept low to facilitate control over the threshold voltage.

The p-channel pinning FET of the present embodiment is obviously different from the n-channel pinning FET of the first embodiment in that it includes an impurity region 207 of the conductivity type opposite to that of the pinning regions 205 and 206 provided therebetween.

The impurity region 207 is a region having the p-type conductivity formed by adding boron or indium. The present embodiment is characterized in that the threshold voltage is controlled using the impurity region 207, which will be described later.

As shown in FIG. 2A, the channel length and channel width of the p-channel pinning FET may be designed similarly to those of the n-channel pinning FET. Therefore, a very minute ion implantation technique is again used to form the pinning regions 205 and 206 and the impurity region 207 for controlling the threshold voltage.

FIG. 2B shows a sectional view taken along the line A–A' in the plan view shown in FIG. 2A. In FIG. 2B, 208 represents a single crystal silicon substrate which is an n-type silicon substrate having high resistance in the present embodiment. Obviously, the high resistance substrate is used to improve mobility.

The pinning regions 205 and 206 are formed such that they overlap the field oxide 204, and the impurity region 207 is formed between them. Further, a gate insulator 209 is formed thereon using a thermal oxidation process.

FIG. 2C shows a sectional view taken along the line B–B' in FIG. 2A. As shown in FIG. 2C, the source region 201 and drain region 203 are formed in a well structure by implanting boron or indium ions.

In the section along the line B–B', the impurity region 207 for controlling the threshold voltage appears as shown in FIG. 2C. While the impurity region 207 is formed across the source region 201 and drain region 203 in the present embodiment, the present invention is not limited to such a structure.

The p-channel pinning FET according to the invention is a semiconductor device having the structure described above. A description will follow on the functions and effects of the pinning regions 205 and 206 and the impurity region 207.

A first effect is an effect of suppressing the expansion of a depletion layer from the drain side as described with reference to the first embodiment. This makes it possible to effectively suppress or prevent the punch-through phenomenon and short channel effects such as a decrease in the threshold voltage.

A second effect will be described below in detail because it is not included in the first embodiment. The present embodiment is similar to the first embodiment in that the narrow channel effect can be intentionally controlled by appropriately changing the impurity concentration and configuration of the pinning regions 205 and 206.

However, when the gate electrode is formed as an n$^+$ type polysilicon gate as in normal ICs, the threshold voltage increases in the negative direction because the gate electrode will have a work function which is only slightly different from that of the channel formation region (which exhibits low n-type conductivity when an n-type silicon substrate is used. This means that the absolute value of the threshold voltage is increased.

Meanwhile, the narrow channel effect also tends to increase the threshold voltage, which results in a considerable increase in the absolute value of the threshold voltage. For this reason, the impurity region 207 is formed for the purpose of decreasing the threshold voltage in the present embodiment.

However, no transistor is formed when the impurity region 207 is connected to the source and drain regions because it is of the same conductivity type as the source and drain regions (p-type here). In the present embodiment, the concentration of the impurities introduced into the impurity region 207 is therefore reduced to produce a very weak p-type state or a substantially near intrinsic state so that this region conducts at a gate voltage lower than that for the channel formation region 202.

That is, the impurity region 207 is intentionally utilized as a path that allows carriers (holes) to move between the source and drain regions with a low threshold voltage. This makes it possible to reduce the threshold voltage when observed as a whole and to realize a normally-off operation.

It is advantageous to adjust the difference between the work functions of the gate electrode and the channel formation region as in the first embodiment. In the present embodiment, the difference in the work functions is preferably made as great as possible to shift the threshold voltage in the positive direction.

It is also advantageous to provide the pinning regions 205 and 206 with weak n-type ($n^-$ type) conductivity to maintain the pinning effect and to suppress the increase of the threshold voltage in the negative direction at the same time.

A third effect is that high mobility can be achieved as in the first embodiment because the channel formation region 202 is intrinsic or substantially intrinsic.

Further, if phosphorus is used as the impurity element added to the pinning regions 205 and 206 of the present embodiment, an effect of gettering metal elements can be provided by phosphorus. This makes it possible to getter metal elements remaining in the channel region 202 into the pinning regions 205 and 206 to reduce impurity scattering in the channel formation region 202 to the extremity.

In this embodiment, again, holes which are the majority carriers flow through the channel formation region 202 and the impurity region 207 and not through the pinning regions 205 and 206.

A fourth effect of ejecting the minority carriers is achieved similarly to the first embodiment. In a normal p-channel MOSFET, since the ionization rate of holes which are the majority carriers is as low as 1/1000 of the ionization rate of electrons, the probability of occurrence of impact ionization is very low. Therefore, breakdown phenomena induced by carrier implantation are not so serious.

In the case of the p-channel pinning FET according to the present invention, however, since the channel formation region is intrinsic or substantially intrinsic, the mobility of the carriers (holes) is very high. That is, a considerably high energy state is expected in the vicinity of the drain.

Therefore, the effect of preventing breakdown phenomena induced by carrier implantation can be regarded as a very advantageous effect in achieving high reliability.

As described above, the p-channel pinning FET of the present embodiment is a semiconductor device in which high reliability and high mobility can be achieved at the same time. Similarly to the first embodiment, the present invention is not limited to the structure of the present embodiment and may be applied to MOSFETs having other structures.

A third embodiment of the invention will now be described.

The first and second embodiments have referred to examples wherein a pinning FET is formed on a single crystal silicon substrate. In such cases, the active region (source region, channel formation region and drain region) is formed from single crystal silicon having weak n-type or p-type conductivity.

However, the semiconductor usable for the present invention is not limited to single crystal silicon. Specifically, in a pinning FET according to the present invention, at least a part of the active region may be in a layer structure comprising a compound semiconductor or comprising a compound semiconductor and single crystal silicon.

For example, gallium arsenide (GaAs), indium phosphide (InP) or silicon germanium ($Si_xGe_{1-x}$ where x is in the range from 0.5 to 9.5) may be used as the compound semiconductor.

In particular, the use of a compound semiconductor expressed by $Si_xGe_{1-x}$ will provide carrier mobility higher than that achievable with single crystal silicon. When combined with the effect provided by the present invention, this effect makes it possible to realize a semiconductor device having higher mobility.

A fourth embodiment of the invention will now be described.

The present embodiment refers to an example of a CMOS semiconductor device in which an n-channel pinning FET and a p-channel pinning FET formed on a p-type single crystal silicon substrate are combined in a complementary manner.

Figure 5A:
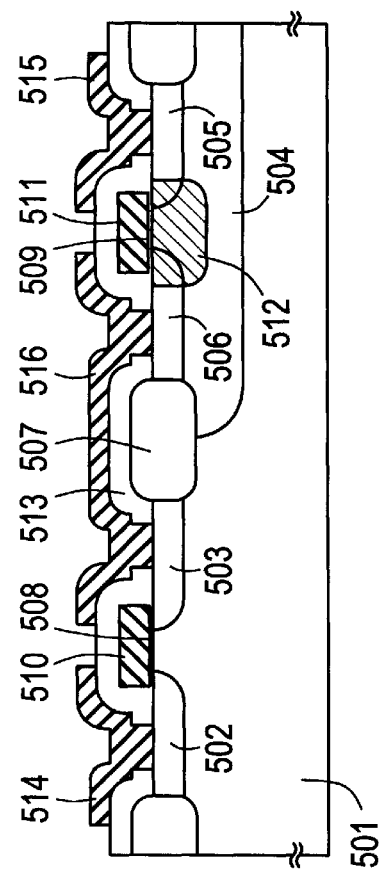
FIGS. 5A and 5B are views showing a structure of a CMOS semiconductor device.
Figure 5B:
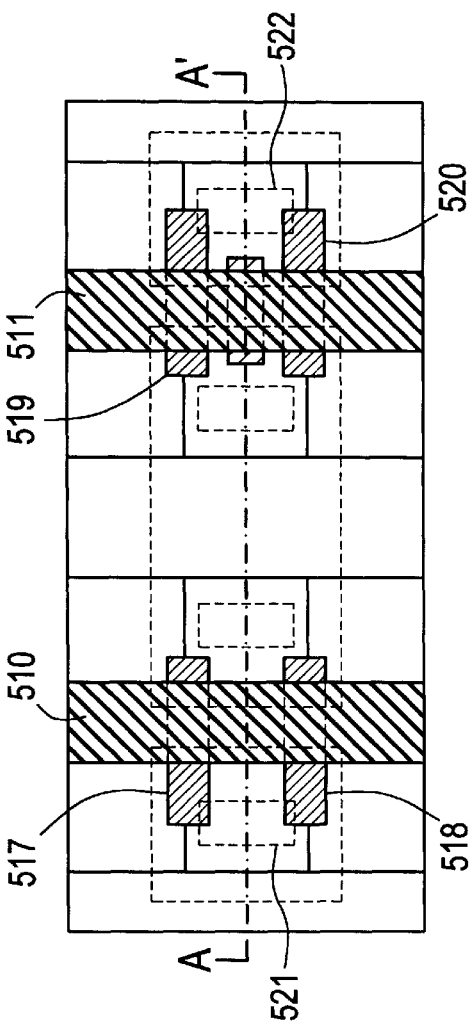

The structure of the CMOS semiconductor device of the present embodiment is shown in FIGS. 5A and 5B. FIG. 5A is a sectional view taken in the channel length direction of the CMOS semiconductor device, and FIG. 5B is a plan view of the CMOS semiconductor device. FIG. 5A corresponds to a sectional view taken along the line A–A' in FIG. 5B.

In FIG. 5A, 501 represents a single crystal silicon substrate. The single crystal silicon substrate 501 is doped with a dopant (boron or arsenic) at a concentration on the order of $1 \times 10^{15}$ atoms/cm$^3$ and exhibits weak p-type conductivity. This conductivity is expressed here by $p^{--}$.

In the present specification, the degree of a conductivity type is expressed by a superscript plus or minus symbol(s). For example, the strength of the n-type conductivity is represented by a relationship $n^{++} > n^+ > n^- > n^{--}$. represents the strength of the n-type conductivity. The strength of the p-type conductivity is represented by a relationship $p^{++} > p^+ > p^- > p^{--}$.

A source region 502 and a drain region 503 in the form of $n^+$ wells of the n-channel pinning FET are formed in the vicinity of the surface of the p-type silicon substrate 501. It is advantageous to bond the source region 502 and drain region 503 at a depth as small as possible in suppressing the short channel effect.

504 represents an $n^{--}$ (or $n^-$) well formed by adding phosphorus (or arsenic or antimony). A source region 505 and a drain region 506 of the p-channel pinning FET are formed therein in the form of $p^+$ wells.

The source and drain regions of different types of conductivity are insulated and separated by a field oxide 507. 508 and 509 represent gate insulators, and 510 and 511 represent gate electrodes of the n-channel and p-channel pinning FETs, respectively.

An impurity region 512 for controlling the threshold voltage is locally formed in a channel formation region (directly under the gate electrode) of the p-channel pinning FET. In the present embodiment, the impurity region 512 has substantially intrinsic or very weak p-type properties for the same reason as described in the first embodiment.

The gate electrodes 510 and 511 are covered by a layer insulator 513, and source electrodes 514 and 515 and a common drain electrode 516 are formed thereon.

The CMOS semiconductor device of the present embodiment is characterized by the arrangement of the source electrodes 514 and 515, which will be described below with reference to FIG. 5B.

In FIG. 5B, the parts which have already been described with reference to FIG. 5A will be indicated by the same reference numbers as those in FIG. 5A and will not be described here. The source electrodes 514 and 515 and the drain electrode 516 are indicated by dotted lines in order to simplify the figure.

Although not shown in FIG. 5A, pinning regions 517 through 520 are formed on both ends of the channel formation region as shown in FIG. 5B. The pinning regions 517 and 518 of the n-channel pinning FET are constituted by $p^+$ regions (or $p^{++}$ regions). The pinning regions 519 and 520 of the p-channel pinning FET are constituted by $n^+$ regions (or n-regions).

As previously described, the pinning regions 517 through 520 according to the invention function as a path for ejecting the minority carrier. It is therefore possible to effectively prevent the accumulation of the minority carriers by employing a structure in which the source electrode 514 and the pinning regions 517, 518 (and the source electrode 515 and the pinning regions 519, 520) are electrically connected.

With such a structure, the source electrodes 514 and 515 and the pinning regions 517 through 520 are at the same potential. Since the source electrodes 514 and 515 are normally grounded, the minority carriers are easily extracted. Obviously, the potential may be set at a value such that the same effect can be achieved even when they are not grounded.

The above-described configuration can be obtained by forming contact holes 521 and 522 in the arrangement as shown in FIG. 5B. Specifically, for the n-channel pinning FET (the left side of the figure), a structure may be employed in which the source electrode 514 contacts the source region 502 in the contact hole and contacts the pinning regions 517 and 518 at the same time.

Obviously, this equally applies to the p-channel pinning FET. However, deterioration of the withstand voltage between the source and drain due to impact ionization is less likely to occur in the p-channel pinning FET in which the majority carriers are holes. It is therefore not necessarily required to extract the minority carriers for the p-channel pinning FET.

As described above, a complementary combination of the n-channel and p-channel pinning FETs described in the first and second embodiments makes it possible to fabricate a CMOS semiconductor device as described in the present embodiment.

It is needless to say that the structure of CMOS semiconductor devices to which the invention can be applied is not limited to the structure shown in the present embodiment. A person who carries out the present invention can add structures such as the LDD structure and salicide structure which are normally used where appropriate.

A fifth embodiment of the present invention will be described.

The present embodiment refers to examples in which structures different from that in the third embodiment are used to extract minority carriers from pinning regions.

Figure 6A:
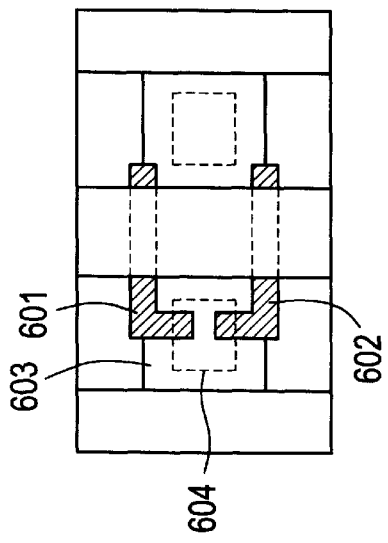
FIGS. 6A and 6B are views showing a configuration of a pinning region.

First, in the structure shown in FIG. 6A, pinning regions 601 and 602 are configured such that they extend into a source region 603. Such a structure makes it possible to increase the area of the pinning regions that is exposed inside a contact hole 604, which allows the area of contact with a source electrode (not shown) to be increased to improve the efficiency of the extraction of holes.

The structure shown in FIG. 6A can be used only when the relationship between the positions of source and drain electrodes is fixed. That is, it is not suitable for cases wherein source and drain regions are periodically switched as encountered in a pixel transistor for an active matrix type display.

Figure 6B:
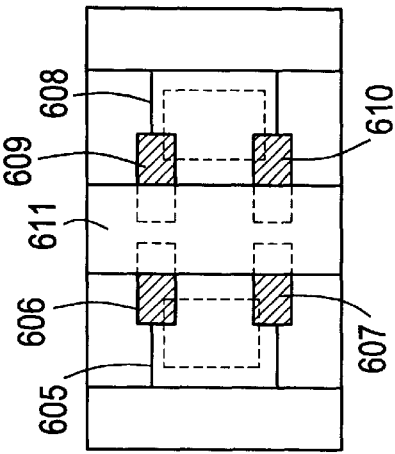

In such cases, the structure shown in FIG. 6B may be used. In FIG. 6B, pinning regions 606 and 607 are electrically connected to a source electrode (or drain electrode) which is not shown in a source region (or drain region) 605, and pinning regions 609 and 610 are electrically connected to a drain electrode (or source electrode) which is not shown in a drain region (or source region) 608.

In this case, the pinning region 606 (or 607) and the pinning region 609 (or 610) are separated from each other under a gate electrode 611 because no transistor can be formed if they are electrically connected. It is advantageous to add the structure shown in FIG. 6A to the structure shown in FIG. 6B.

Obviously, the present embodiment is merely an example and there is no need to limit the present invention to those structures. Specifically, a person who carries out the invention may freely design the shape of the pinning regions and the arrangement of the contact holes for the source electrode as long as a configuration is used in which minority carriers flowing through the pinning regions can be effectively extracted.

A sixth embodiment of the present invention will now be described.

The present embodiment is examples of other configurations of the impurity region for controlling the threshold voltage in the p-channel pinning FET shown in the second embodiment. While FIGS. 7A, 7B and 7C are referred to, the description will be made only on areas indicated by reference numbers which must be described because the basic structure has already been described in detail with reference to FIGS. 2A, 2B and 2C.

Figure 7A:
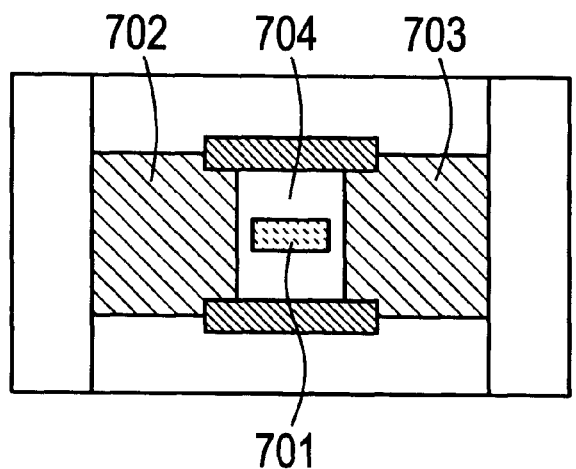
FIGS. 7A, 7B and 7C are views showing configurations of an impurity region for controlling a threshold voltage.

FIG. 7A shows a structure wherein an impurity region 701 for controlling the threshold voltage is separated from a source region 702 and a drain region 703. In this case, the region indicated by 704 is a channel formation region. However, the impurity region 701 can be regarded as functioning substantially similarly to the channel formation region because holes which are the majority carriers are induced in this region to contribute to hole conduction.

Figure 7B:
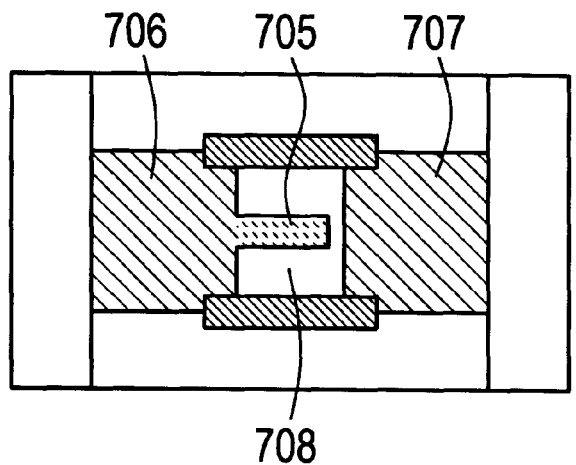

FIG. 7B shows a structure in which an impurity region 705 for controlling the threshold voltage is integrated with a source region 706 and is separated from only a drain region 707. In this case, the region indicated by 708 is a channel formation region.

Figure 7C:
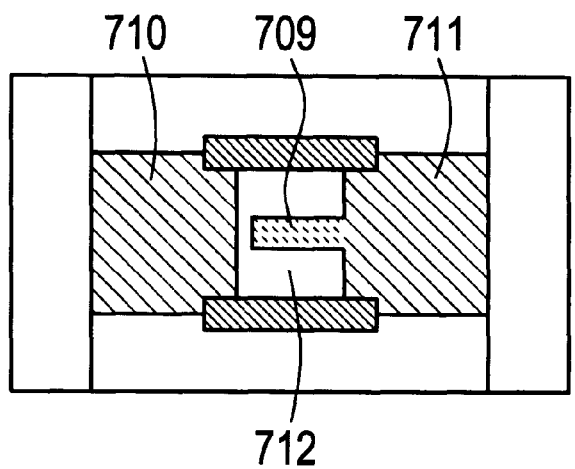

FIG. 7C shows a structure in which an impurity region 709 for controlling the threshold voltage is separated from a source region 710 and is integrated with a drain region 711. In this case, the region indicated by 712 is a channel formation region.

All of the above-described structures are designed to reduce a leakage current between the source and drain (or an off-current) as much as possible. Specifically, since the impurity region for controlling the threshold voltage is separated from the source or drain region or from both of them, no carrier moves between the source and drain unless the channel formation region is inverted.

In the second embodiment, it is necessary to suppress the concentration of the impurities included in the impurity region for controlling the threshold voltage in order to prevent any short-circuit between the source and drain. With the structures in the present embodiment, however, no problem occurs even if the doping concentration is increased.

This increases the freedom in selecting the concentration of the impurity element (boron or indium) added to the impurity regions 701, 705 and 709 to increase the processing margin. That is, the adjustment of the threshold voltage is very much facilitated.

A seventh embodiment of the invention will now be described.

The present invention may be applied to a buried channel type FET. A buried channel type FET can achieve mobility higher than that of a surface channel type FET because the carriers move inside the channel formation region thereof and, as a result, no reduction of carrier mobility attributable to surface scattering can occur. However, a buried channel type FET has a problem in that it has low withstand voltage characteristics because it is vulnerable to punch-through.

When a configuration according to the invention is used to form a buried channel type pinning FET, it is possible to prevent any reduction in the withstand voltage between the source and drain due to punch-through while maintaining high mobility.

An eighth embodiment of the invention will now be described.

The present invention may be applied to conventional IC techniques in general. Specifically, it may be applied to all semiconductor devices (products including a MOSFET as a component thereof) currently sold in the market. The term "semiconductor devices" as used in this specification implies not only discrete devices but also integrated circuits formed of a plurality of discrete devices and electrooptical apparatuses (appliances) loaded with such integrated circuits.

For example, the present invention may be applied to RISC processors integrated on one chip and microprocessors such as ASIC processors. It may be further applied to all integrated circuits utilizing semiconductors including signal processing circuits such as D-A converters and high frequency circuits for portable apparatuses (portable telephones, PHS's, mobile computers, etc.).

Figure 8A:
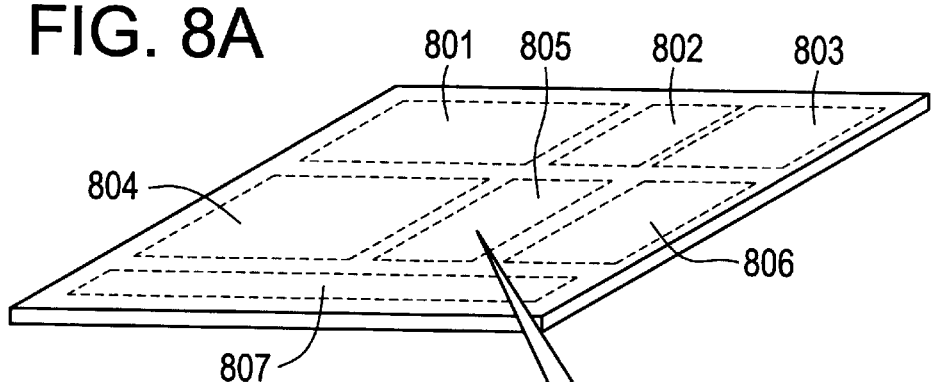
FIGS. 8A, 8B and 8C are views for explaining an example of the application of a semiconductor device.
Figure 8B:
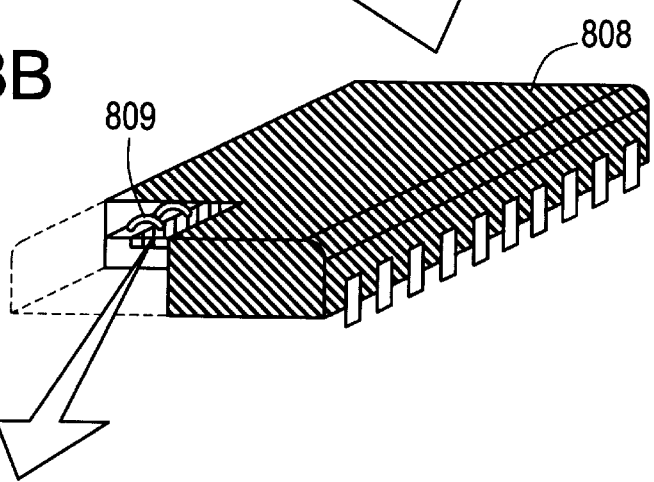
Figure 8C:
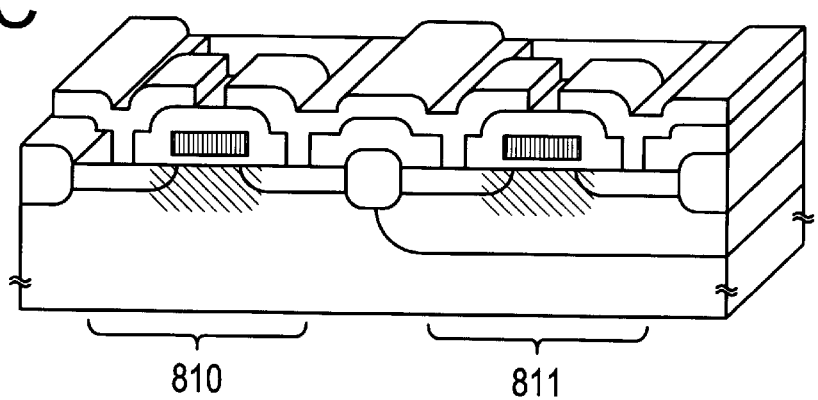

FIGS. 8A, 8B and 8C show an example of a microprocessor. The microprocessor comprises a CPU core 801, a RAM 802, a clock controller 803, a cache memory 804, a cache controller 805, a serial interface 806, an I/O port 807, etc.

Obviously, the microprocessor shown in FIGS. 8A, 8B and 8C is a simplified example, and the circuit of an actual microprocessor is designed in various ways depending of its application.

However, an IC (integrated circuit) 808 always functions as a heart of a microprocessor regardless of the function of the microprocessor. The IC 808 is a functional circuit which is an integrated circuit formed on a semiconductor chip 809 and protected by ceramic or the like. The integrated circuit formed on the semiconductor chip 809 is constituted by pinning FETs 810 (n-channel type) and 811 (p-channel type) according to the present invention. Basic circuits are often configured using a CMOS as a minimum unit.

Further, the microprocessor shown in the present embodiment is loaded on various electrooptical apparatuses to function as the core circuit thereof. Typical electrooptical apparatuses include personal computers, portable information terminals and all kinds of electric appliances.

The present invention makes it possible to suppress or prevent the short channel effect from adversely affecting fine semiconductor devices having very small channel length and channel width. Specifically, any decrease in the withstand voltage between the source and drain and the threshold voltage attributable to punch-through can be simultaneously avoided.

Further, since the above-described effect can be achieved without including extra impurities in the channel formation region (the region where the carriers move), carrier mobility is not affected. As a result, there is provided a semiconductor device having very high mobility that directly reflects high mobility inherent to single crystal silicon.

By utilizing pinning regions formed in the channel formation region as wiring for extracting minority carriers, it is possible to prevent any reduction in the withstand voltage between the source and drain due to impact ionization.

The above-described effects in combination make it possible to provide a semiconductor device in which very high mobility and high reliability is achieved at the same time.

The foregoing detailed description of the invention is provided for the purposes of illustration and is not intended to be exhaustive or to limit the invention to the precise embodiment disclosed. Accordingly, the scope of the present invention is defined by the appended claims.

What is claimed is:

1. A semiconductor device comprising at least:
    a source region, a drain region and a channel formation region formed using a single crystal semiconductor;
    a field oxide surrounding said source region, drain region and channel formation region; and
    a gate insulator and a gate electrode formed over said channel formation region, wherein
    an impurity region shifting an energy band of said channel formation region is intentionally and locally provided only at an end of said channel formation region which is in contact with said field oxide,
    said impurity region suppresses the expansion of a depletion layer from said drain region toward said source region,
    the length of said channel formation region (channel length) is in the range from 30 to 500 nm and wherein the width of said channel formation region (channel width) is in the range from 30 to 500 nm, and
    said impurity region is doped with an impurity element of a conductivity type opposite to a conductivity type of said source region and said drain region.

2. The device according to claim 1, wherein said source region and said drain region are doped with an element selected from among the group 15 and wherein said impurity region is doped with an element selected from among the group 13.

3. The device according to claim 1, wherein said channel formation region serves as a path for the movement of majority carriers and wherein said impurity region serves as a path for the movement of minority carriers.

4. The device according to claim 1, wherein said channel formation region is a region which is intrinsic or substantially intrinsic.

5. The device according to claim 2, wherein said element selected from among the group 15 is phosphorus, arsenic or antimony and wherein said element selected from among the group 13 is boron or indium.

6. A semiconductor device comprising at least:
- a source region, a drain region and a channel formation region formed using a single crystal semiconductor;
- a field oxide surrounding said source region, drain region and channel formation region; and
- a gate insulator and a gate electrode formed over said channel formation region, wherein
- an impurity region shifting an energy band of said channel formation region is intentionally and locally provided only at an end of said channel formation region which is in contact with said field oxide,
- said impurity region suppresses the expansion of a depletion layer from said drain region toward said source region and extracts minority carriers generated as a result of impact ionization in the vicinity of said drain region from said channel formation region,
- the length of said channel formation region (channel length) is in the range from 30 to 500 nm and wherein the width of said channel formation region (channel width) is in the range from 30 to 500 nm, and
- said impurity region is doped with an impurity element of a conductivity type opposite to a conductivity type of said source region and said drain region.

7. The device according to claim 6, wherein said source region and said drain region are doped with an element selected from among the group 15 and wherein said impurity region is doped with an element selected from among the group 13.

8. The device according to claim 6, wherein said channel formation region serves as a path for the movement of majority carriers and wherein said impurity region serves as a path for the movement of minority carriers.

9. The device according to claim 6, wherein said channel formation region is a region which is intrinsic or substantially intrinsic.

10. A semiconductor device comprising at least:
- a source region, a drain region and a channel formation region formed using a single crystal semiconductor;
- a field oxide surrounding said source region, drain region and channel formation region; and
- a gate insulator and a gate electrode formed over said channel formation region, wherein
- an impurity region shifting an energy band of said channel formation region is intentionally and locally provided only at an end of said channel formation region which is in contact with said field oxide,
- said impurity region extends also into said source region and/or drain region,
- the length of said channel formation region (channel length) is in the range from 30 to 500 nm and wherein the width of said channel formation region (channel width) is in the range from 30 to 500 nm, and
- said impurity region is doped with an impurity element of a conductivity type opposite to a conductivity type of said source region and said drain region.

11. The device according to claim 10, wherein said source region and said drain region are doped with an element selected from among the group 15 and wherein said impurity region is doped with an element selected from among the group 13.

12. The device according to claim 10, wherein said channel formation region serves as a path for the movement of majority carriers and wherein said impurity region serves as a path for the movement of minority carriers.

13. The device according to claim 10, wherein said channel formation region is a region which is intrinsic or substantially intrinsic.

14. The device according to claim 10, wherein said element selected from among the group 15 is phosphorus, arsenic or antimony and wherein said element selected from among the group 13 is boron or indium.

15. A semiconductor device comprising at least:
- a source region, a drain region and a channel formation region formed using a single crystal semiconductor;
- a field oxide surrounding said source region, drain region and channel formation region; and
- a gate insulator and a gate electrode formed over said channel formation region, wherein
- impurity regions shifting an energy band of said channel formation region are intentionally and locally provided only at a central portion of said channel formation region and an end of said channel formation region which is in contact with said field oxide,
- said impurity region provided at the end suppresses the expansion of a depletion layer from said drain region toward said source region,
- said impurity region provided in the central portion controls a threshold voltage,
- the length of said channel formation region (channel length) is in the range from 30 to 500 nm and wherein the width of said channel formation region (channel width) is in the range from 30 to 500 nm, and
- said impurity region provided at the end is doped with an impurity element of a conductivity type opposite to a conductivity type of said source region and said drain region and wherein said impurity region provided at the central portion is doped with an impurity element of a same conductivity type as the conductivity type of said source region and said drain region.

16. The device according to claim 15, wherein said source region, said drain region and said impurity region provided at the central portion are doped with an element selected from among the group 13 and wherein said impurity region provided at the end is doped with an element selected from among the group 15.

17. The device according to claim 16, wherein said element selected from among the group 15 is phosphorus, arsenic or antimony and wherein said element selected from among the group 13 is boron or indium.

18. The device according to claim 15, wherein said channel formation region and said impurity region provided at the central portion serve as a path for the movement of majority carriers and wherein said impurity region provided at the end serves as a path for the movement of minority carriers.

19. The device according to claim 15, wherein said channel formation region is a region which is intrinsic or substantially intrinsic.

20. The device according to claim 15, wherein said impurity region provided at the central portion is a linear region substantially in parallel with the direction of an electric field formed between the source and drain.

21. A semiconductor device comprising at least:
- a source region, a drain region and a channel formation region formed using a single crystal semiconductor;
- a field oxide surrounding said source region, drain region and channel formation region; and
- a gate insulator and a gate electrode formed over said channel formation region, wherein
- impurity regions shifting an energy band of said channel formation region are intentionally and locally provided only at a central portion of said channel formation region and an end of said channel formation region which is in contact with said field oxide, said impurity region provided at the end suppresses the expansion of a depletion layer from said drain region toward said source region and extracts minority carriers generated as a result of impact ionization in the vicinity of said drain region from said channel formation region, said impurity region provided at the central portion controls a threshold voltage, the length of said channel formation region (channel length) is in the range from 30 to 500 nm and wherein the width of said channel formation region (channel width) is in the range from 30 to 500 nm, and said impurity region provided at the end is doped with an impurity element of a conductivity type opposite to a conductivity type of said source region and said drain region and wherein said impurity region provided at the central portion is doped with an impurity element of a same conductivity type as the conductivity type of said source region and said drain region.

22. The device according to claim 21, wherein said source region, said drain region and said impurity region provided at the central portion are doped with an element selected from among the group 13 and wherein said impurity region provided at the end is doped with an element selected from among the group 15.

23. The device according to claim 22, wherein said element selected from among the group 15 is phosphorus, arsenic or antimony and wherein said element selected from among the group 13 is boron or indium.

24. The device according to claim 21, wherein said channel formation region and said impurity region provided at the central portion serve as a path for the movement of majority carriers and wherein said impurity region provided at the end serves as a path for the movement of minority carriers.

25. The device according to claim 21, wherein said channel formation region is a region which is intrinsic or substantially intrinsic.

26. The device according to claim 21, wherein said impurity region provided at the central portion is a linear region substantially in parallel with the direction of an electric field formed between the source and drain.

27. The device according to claim 1 wherein at least a portion of said impurity region is provided under said gate electrode.

28. The device according to claim 6 wherein at least a portion of said impurity region is provided under said gate electrode.

29. The device according to claim 10 wherein at least a portion of said impurity region is provided under said gate electrode.

30. The device according to claim 15 wherein at least a portion of said impurity region provided at the end is provided under said gate electrode.

31. The device according to claim 21 wherein at least a portion of said impurity region provided at the end is provided under said gate electrode.

32. A semiconductor device comprising at least:
a source region, a drain region and a channel formation region formed using a single crystal semiconductor;
a field oxide surrounding said source region, drain region and channel formation region; and
a gate insulator and a gate electrode formed over said channel formation region, wherein an impurity region shifting an energy band of said channel formation region is intentionally and locally provided only at an end of said channel formation region which is in contact with said field oxide, said impurity region suppresses the expansion of a depletion layer from said drain region toward said source region, said impurity region is deeper than a junction depth of said drain region, and said impurity region is doped with an impurity element of a conductivity type opposite to a conductivity type of said source region and said drain region.

33. A semiconductor device comprising at least:
a source region, a drain region and a channel formation region formed using a single crystal semiconductor;
a field oxide surrounding said source region, drain region and channel formation region; and
a gate insulator and a gate electrode formed over said channel formation region, wherein an impurity region shifting an energy band of said channel formation region is intentionally and locally provided only at an end of said channel formation region which is in contact with said field oxide, said impurity region suppresses the expansion of a depletion layer from said drain region toward said source region and extracts minority carriers generated as a result of impact ionization in the vicinity of said drain region from said channel formation region, said impurity region is deeper than a junction depth of said drain region, and said impurity region is doped with an impurity element of a conductivity type opposite to a conductivity type of said source region and said drain region.

34. A semiconductor device comprising at least:
a source region, a drain region and a channel formation region formed using a single crystal semiconductor;
a field oxide surrounding said source region, drain region and channel formation region; and
a gate insulator and a gate electrode formed over said channel formation region, wherein an impurity region shifting an energy band of said channel formation region is intentionally and locally provided only at an end of said channel formation region which is in contact with said field oxide, said impurity region extends also into said source region and/or drain region, said impurity region is deeper than a junction depth of said drain region, and said impurity region is doped with an impurity element of a conductivity type opposite to a conductivity type of said source region and said drain region.

35. A semiconductor device comprising at least:
a source region, a drain region and a channel formation region formed using a single crystal semiconductor;
a field oxide surrounding said source region, drain region and channel formation region; and
a gate insulator and a gate electrode formed over said channel formation region, wherein impurity regions shifting an energy band of said channel formation region are intentionally and locally provided only at a central portion of said channel formation region and an end of said channel formation region which is in contact with said field oxide, said impurity region provided at the end suppresses the expansion of a depletion layer from said drain region toward said source region, said impurity region provided in the central portion controls a threshold voltage, said impurity region provided at the end is deeper than a junction depth of said drain region, and said impurity region provided at the end is doped with an impurity element of a conductivity type opposite to a conductivity type of said source region and said drain region and wherein said impurity region provided at the central portion is doped with an impurity element of a same conductivity type as the conductivity type of said source region and said drain region.

36. A semiconductor device comprising at least:

a source region, a drain region and a channel formation region formed using a single crystal semiconductor;

a field oxide surrounding said source region, drain region and channel formation region; and a gate insulator and a gate electrode formed over said channel formation region, wherein impurity regions shifting an energy band of said channel formation region are intentionally and locally provided only at a central portion of said channel formation region and an end of said channel formation region which is in contact with said field oxide, said impurity region provided at the end suppresses the expansion of a depletion layer from said drain region toward said source region and extracts minority carriers generated as a result of impact ionization in the vicinity of said drain region from said channel formation region, said impurity region provided at the central portion controls a threshold voltage, said impurity region provided at the end is deeper than a junction depth of said drain region, and said impurity region provided at the end is doped with an impurity element of a conductivity type opposite to a conductivity type of said source region and said drain region and wherein said impurity region provided at the central portion is doped with an impurity element of a same conductivity type as the conductivity type of said source region and said drain region.

37. The device according to claim 32 wherein at least a portion of said impurity region is provided under said gate electrode.

38. The device according to claim 33 wherein at least a portion of said impurity region is provided under said gate electrode.

39. The device according to claim 34 wherein at least a portion of said impurity region is provided under said gate electrode.

40. The device according to claim 35 wherein at least a portion of said impurity region provided at the end is provided under said gate electrode.

41. The device according to claim 36 wherein at least a portion of said impurity region provided at the end is provided under said gate electrode.

42. The device according to claim 32 wherein the length of said channel formation region (channel length) is in the range from 30 to 500 nm and wherein the width of said channel formation region (channel width) is in the range from 30 to 500 nm.

43. The device according to claim 33 wherein the length of said channel formation region (channel length) is in the range from 30 to 500 nm and wherein the width of said channel formation region (channel width) is in the range from 30 to 500 nm.

44. The device according to claim 34 wherein the length of said channel formation region (channel length) is in the range from 30 to 500 nm and wherein the width of said channel formation region (channel width) is in the range from 30 to 500 nm.

45. The device according to claim 35 wherein the length of said channel formation region (channel length) is in the range from 30 to 500 nm and wherein the width of said channel formation region (channel width) is in the range from 30 to 500 nm.

46. The device according to claim 36 wherein the length of said channel formation region (channel length) is in the range from 30 to 500 nm and wherein the width of said channel formation region (channel width) is in the range from 30 to 500 nm.

* * * * *